US007518135B2

(12) United States Patent
Ivanov et al.

(10) Patent No.: US 7,518,135 B2
(45) Date of Patent: Apr. 14, 2009

(54) REDUCING FAST IONS IN A PLASMA RADIATION SOURCE

(75) Inventors: Vladimir Vital'evich Ivanov, Moscow (RU); Vadim Yevgenyevich Banine, Helmond (NL); Konstantin Nikolaevich Koshelev, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 140 days.

(21) Appl. No.: 11/641,945

(22) Filed: Dec. 20, 2006

(65) Prior Publication Data

US 2008/0151205 A1 Jun. 26, 2008

(51) Int. Cl.
*H01J 65/04* (2006.01)
(52) U.S. Cl. .............................. 250/504 R; 250/493.1; 250/492.2; 378/119
(58) Field of Classification Search ............. 250/504 R, 250/493.1, 492.2; 378/119; 315/111.21
See application file for complete search history.

(56) References Cited

U.S. PATENT DOCUMENTS

| 3,524,101 | A | 8/1970 | Barbini | |
| 4,709,373 | A | 11/1987 | Scott et al. | |
| 6,300,720 | B1 * | 10/2001 | Birx | 315/111.21 |
| 7,208,746 | B2 * | 4/2007 | Koshelev et al. | 250/492.2 |
| 2005/0031004 | A1 | 2/2005 | Basting et al. | |
| 2006/0011864 | A1 | 1/2006 | Koshelev et al. | |
| 2008/0017810 | A1 * | 1/2008 | Frijns | 250/492.2 |

FOREIGN PATENT DOCUMENTS

WO WO 2005/02032 A2 6/2005

OTHER PUBLICATIONS

International Search Report for International Application No. PCT/NL2007/050670 dated Sep. 11, 2008.

* cited by examiner

*Primary Examiner*—Kiet T Nguyen
(74) *Attorney, Agent, or Firm*—Pillsbury Winthrop Shaw Pittman, LLP

(57) ABSTRACT

A radiation source with an anode and a cathode to create a discharge in a discharge space between the anode and the cathode is disclosed. A plasma is formed in the radiation source which generates electromagnetic radiation, such as EUV radiation. The radiation source includes a first activation source to direct a first energy pulse onto a first spot in the radiation source near the discharge space to create a main plasma channel which triggers the discharge. The radiation source also has a second activation source to direct a second energy pulse onto a second spot in the radiation source near the discharge space to create an additional plasma channel. By directing the second energy pulse during the same discharge, a shortcutting of the main plasma current is realized which in turn may reduce the amount of fast ions produced.

20 Claims, 2 Drawing Sheets

REDUCING FAST IONS IN A PLASMA RADIATION SOURCE

FIELD

The present invention relates to a lithographic apparatus and a plasma radiation source for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to decrease the critical dimension of devices, a lithographic projection apparatus may be arranged with a radiation source for EUV radiation. The radiation source for EUV radiation may be a discharge plasma radiation source, in which a plasma is generated in a substance (for instance, a gas or vapor) between an anode and a cathode and in which a high temperature discharge plasma may be created by Ohmic heating by a (pulsed) current flowing through the plasma.

Existing discharge based EUV sources for EUV lithography are based on a plasma pinch effect. As an additional product of the plasma pinch, fast ions appear which may sputter optics in the lithography apparatus. The amount and distribution of energy of fast ions in an EUV radiation source depend on the amount of energy in one pulse. The larger the energy of one pulse, the larger the number of fast ions and their mean energy and thus the larger the sputtering rate of the optics.

SUMMARY

It is desirable, for example, to provide a plasma radiation source in which fast ions formation is decreased.

According to an aspect of the invention, there is provided a radiation source, comprising:
an anode and a cathode that are configured and arranged to create a discharge in a substance in a discharge space between the anode and the cathode and to form a plasma so as to generate electromagnetic radiation;
a first activation source arranged to direct a first energy pulse onto a first spot in the radiation source near the discharge space so as to create a main plasma channel which triggers the discharge; and
a second activation source arranged to direct a second energy pulse onto a second spot in the radiation source near the discharge space so as to create an additional plasma channel, the second spot being a different spot than the first spot and the second activation source arranged to generate the second energy pulse during the discharge.

According to a further aspect of the invention, there is provided a lithographic apparatus, comprising:
a radiation source, comprising:
an anode and a cathode that are configured and arranged to create a discharge in a substance in a discharge space between the anode and the cathode and to form a plasma so as to generate electromagnetic radiation,
a first activation source arranged to direct a first energy pulse onto a first spot in the radiation source near the discharge space so as to create a main plasma channel which triggers the discharge, and
a second activation source arranged to direct a second energy pulse onto a second spot in the radiation source near the discharge space so as to create an additional plasma channel, the second spot being a different spot than the first spot and the second activation source arranged to generate the second energy pulse during the discharge;
an illumination system configured to condition the electromagnetic radiation into a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

According to another aspect of the invention, there is provided a method of producing radiation, comprising:
creating a voltage across an anode and a cathode of a radiation source;
directing a first energy pulse onto a first spot in the radiation source so as to create a main plasma channel which triggers a discharge between the anode and the cathode;
directing a second energy pulse onto a second spot in the radiation source so as to create an additional plasma channel between the anode and the cathode, the second spot being a different spot than the first spot and the second energy pulse being generated during the discharge.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
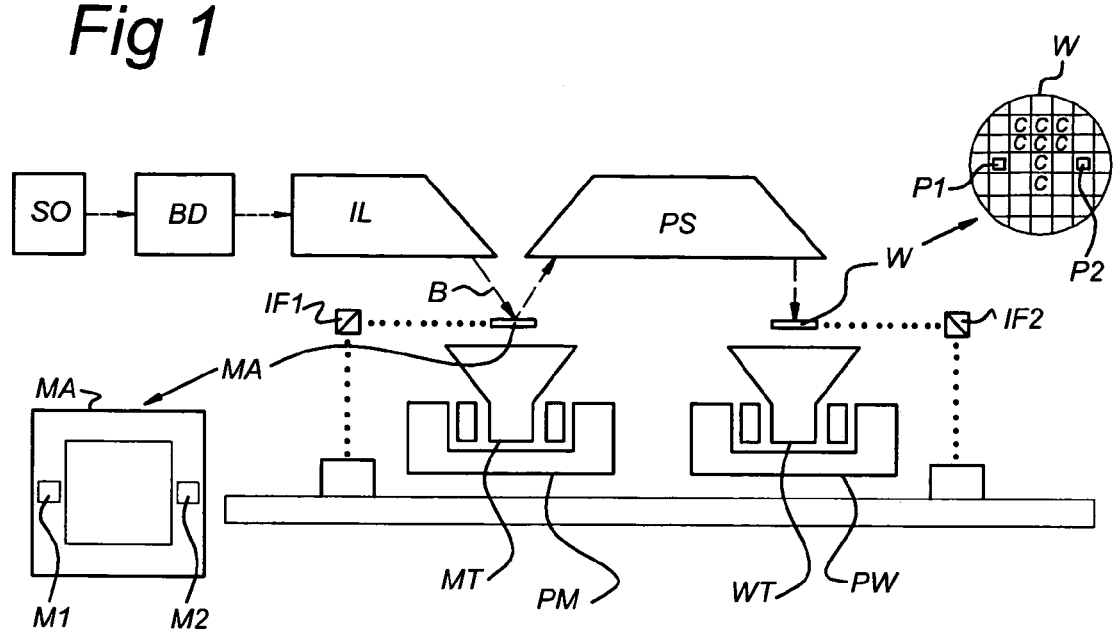
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation);
a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a plasma radiation source SO. The plasma radiation source SO and the lithographic apparatus may be separate entities. In such cases, the source is not considered to form part of the lithographic apparatus and the radiation beam is passed from the plasma radiation source SO to the illuminator IL with the aid of a beam delivery system BD comprising, for example, suitable directing mirrors and/or a beam expander. The plasma radiation source SO and the illuminator IL, together with the beam delivery system BD if required, may be referred to as a 'radiation system'.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The radiation source SO according to an embodiment, comprises an anode and a cathode that are configured and arranged to create a discharge in a substance in a discharge space between the anode and the cathode. A temporary plasma pinch will be formed which will collapse to generate electromagnetic radiation, such as EUV radiation. At the voltage applied (2-5 kV), in addition to the production of the electromagnetic radiation, fast ions are produced as a result of the collapse of the plasma pinch.

According to an embodiment of the invention, a first energy pulse creates a main plasma channel which triggers the discharge. At a certain stage of the discharge development, a second energy pulse creates a second conducting plasma channel in a close vicinity to the main plasma channel. The first energy pulse may also be referred to as the main energy pulse, and the second energy pulse may also be referred to as an additional energy pulse.

Figure 2:
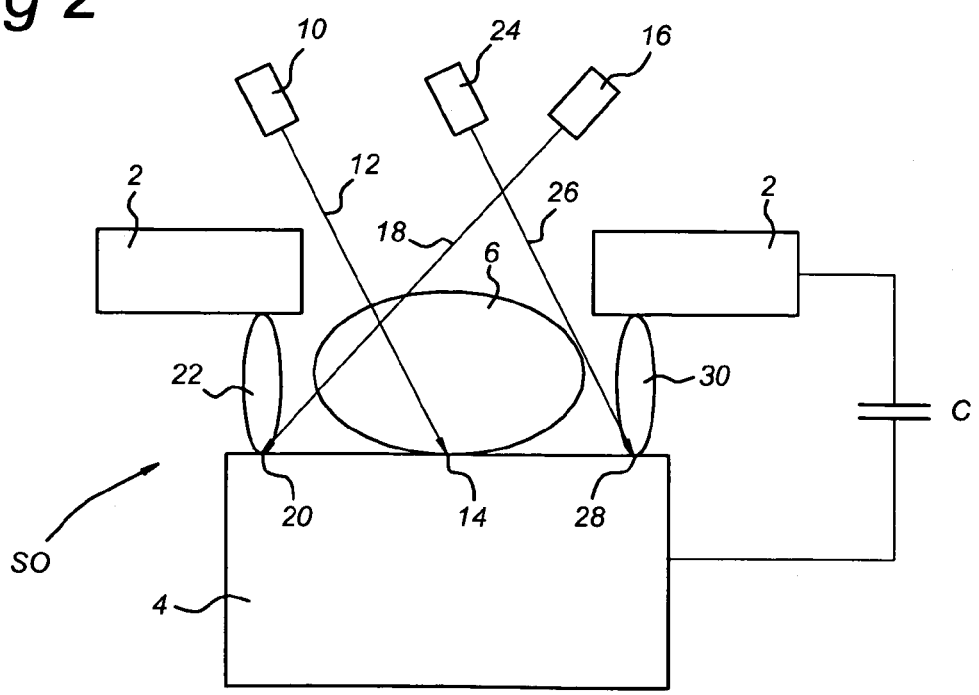
FIG. 2 shows a plasma radiation source according to an embodiment of the invention.

FIG. 2 schematically shows a plasma radiation source SO according to an embodiment. The source SO comprises an anode 2 and a cathode 4. The anode 2 and the cathode 4 are arranged to create a discharge in a substance, e.g. tin vapor, in the discharge space between the anode 2 and the cathode 4 by applying a sufficient voltage across the anode 2 and the cathode 4 as will be known to the skilled person. As will be known to the skilled person, a pinching plasma 6 will be created which produces electromagnetic radiation, comprising EUV radiation. It is noted that the pinching plasma 6 is at first instance a main plasma channel 6, which is pinched. The radiation source SO further comprises a first activation source 10 which may be a laser beam source 10. The laser beam source 10 is arranged to direct a first energy pulse 12 onto a first spot 14 of the radiation source SO near the discharge space. This will ablate the spot 14 and create a plasma channel (referred to as the main plasma channel) and as a consequence triggers the discharge. According to an embodiment, the radiation source SO further comprises a second activation source 16 arranged to direct a second energy pulse 18, such as a laser pulse 18, on a second spot 20 of the radiation source SO near the discharge space. This will create an additional plasma channel 22. According to an embodiment, the location of the second spot 20 is different from the location of the first spot 14, and the second activation source 16 is arranged to create the second plasma channel 22 during the same discharge. It is noted that the first activation source 10 and the second activation source 16 can be incorporated in one activation source wherein the second energy pulse 18 is directed in a different direction than the first energy pulse, by way of for example, a rotating mirror. In an embodiment, the first and/or second spots may located on the anode and/or the first and/or second spots may located on the cathode.

Fast ions are produced at a later stage of a plasma collapse than in which the EUV radiation is produced. The fast ions receive their energy from magnetic field energy, which is proportional to $I^2$, where I is the discharge current from the anode 2 to the cathode 4. This means, that if the discharge current I decreases fast enough just after the EUV emission, the number of fast ions will decrease. The radiating collapse of the plasma 6 is optimally near the maximum of the discharge current I, therefore the following applies:

$$L*dI/dt=-RI \qquad (1)$$

where R is the resistance of the pinch in the main plasma channel and L is full inductance of discharge source:

$$d(ln(I))/dt=-R/L \qquad (2)$$

Note that the resistance R is an internal parameter of the discharge process and it is difficult to change it without decreasing Conversion Efficiency (CE). By creating the second plasma channel 22 between the anode 2 and the cathode 4, a parallel current path is created. As a result, discharge current will be redirected to a new current path with smaller resistivity. The process of full redirection can be made very short (below a few nanoseconds) due to the small inductance of the circuit created by the main and the second plasma channels. The parallel current path is in fact forming a short circuit between the anode 2 and the cathode 4. An electrical circuit is created which looks like: cathode 4—main plasma channel 6—anode 2—second plasma channel 22. This circuit has a relatively small inductance (~several nH) in which the pinch discharge current will quickly dissipate with an appropriate increase of current in the second plasma channel. A fast decrease of the discharge current will considerably reduce fast ions formation.

The second laser pulse 18 is directed to the spot 20 in such a way that it is delayed with respect to the first laser pulse 12 generated by the first activation source 10. In an embodiment, a time delay between the two laser pulses is adjusted so as to create the second plasma channel close to the end of EUV generation phase e.g. ~10-100 ns. In an embodiment, the delay time is tuned depending on the amount of fast ions measured in a location near the radiation source SO.

In FIG. 2, the radiation source SO is shown which comprises an axisymmetrical anode 2 and cathode 4. Actually only one additional laser beam, i.e. laser beam 18, needs to be used to create the additional plasma channel 22. But according to a further embodiment, a third activation source 24 is provided which is arranged to produce an energy pulse, such as a laser pulse 26, that is directed to a third spot 28 on the cathode 4. This will result in a third plasma channel 30, see FIG. 2, occurring together with the second plasma channel 22 described above. Note that it is conceivable that the third laser beam hits the cathode 4 after the additional laser beam 18 hits the cathode 4. This may be advantageous in decreasing the inductance of the shortcutting circuit and decreasing the number of fast ions. The number and shape of the additional plasma channels 22, 30 may be chosen properly to minimize the shortcutting inductance as will be known to the skilled person. It is noted that the radiation source SO may have a different form and geometry than the one shown in FIG. 2. The radiation source SO may well comprise a third body on which surface a laser is directed to create the additional plasma channel(s) 22, 30.

Figure 3:
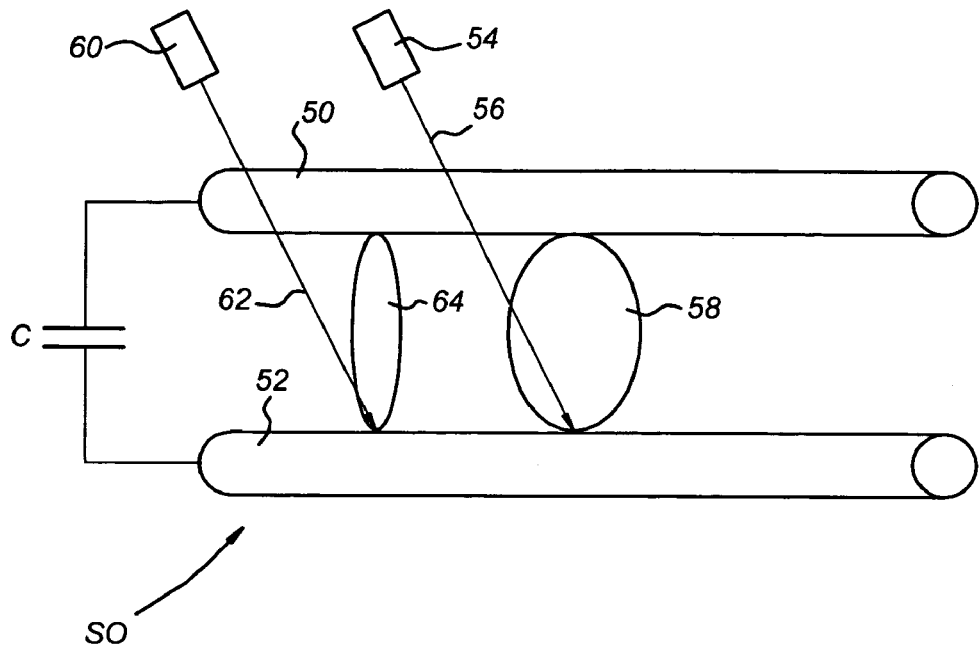
FIG. 3 shows a plasma radiation source according to a further embodiment of the invention.

FIG. 3 shows a further embodiment of the radiation source SO comprising a liquid jet anode 50 and a liquid jet cathode 52. The liquid anode 50 and the liquid cathode 52 are produced in a way as will be known to the skilled person. According to an embodiment, a first activation source 54 is arranged to direct a first laser beam 56 onto the cathode 52. This will result in a main plasma channel 58 triggering a discharge. During this discharge, a second laser pulse 62 is directed to the cathode 52 by means of a second activation source 60. This will result in a short circuit between the liquid jet cathode 52 and the liquid jet anode 50, as is explained above with reference to FIG. 2. More liquid anodes or specially produced third bodies (e.g. droplets) may be used for creating (a) second plasma channel(s).

Figure 4:
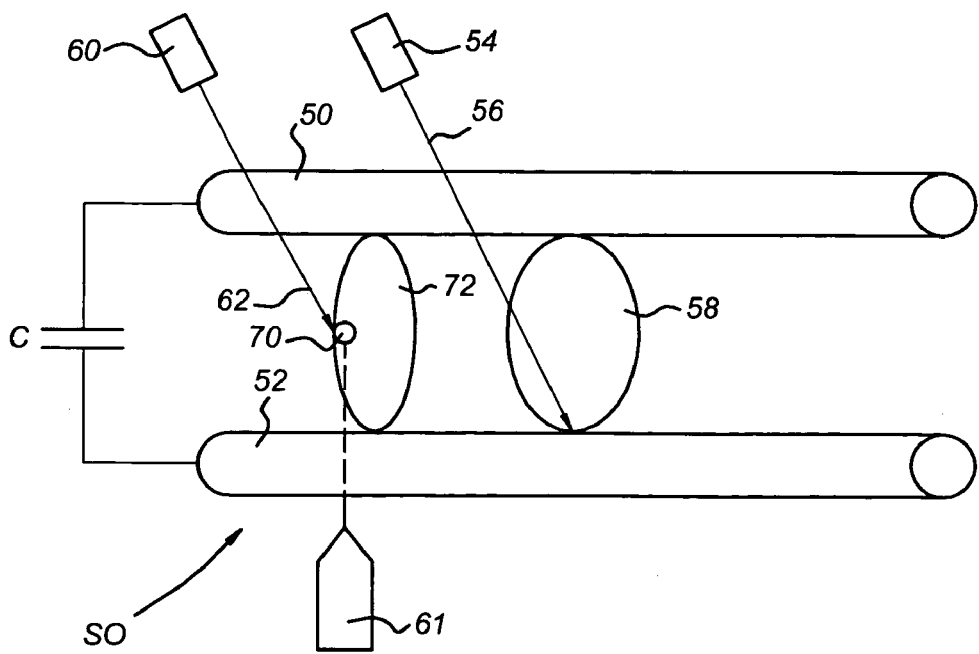
FIG. 4 shows a plasma radiation source according to a further embodiment of the invention.

FIG. 4 shows an embodiment, in which droplets 70 are shot in between the liquid jet cathode 52 and liquid jet anode 50. The droplets 70 are produced by a droplet producing unit 61. The droplets 70 may be liquid metal droplets, but alternatively, they may be produced by using non-conductive material such as water or xenon. The technique for producing such droplets is widely used in Laser Plasma Produced (LPP) radiation sources, as will be known to the skilled person. In an embodiment, a series of droplets of e.g. 40 mm diameter with e.g. 40 mm distance between them with a velocity of e.g. 10 m/s may be provided. The position and size of these droplets can be very well defined (~several mm). The radiation source SO may comprise a control mechanism arranged to control the activation sources 54, 60 to send laser pulses at the droplets having certain time intervals between two consecutive laser pulses. The process of heating (ablation) the droplet is the same as for the main laser pulse focused on the liquid cathode 52. The droplet material is heated and evaporated by focused laser pulse 62, then laser breakdown in vapor follows. After that, laser pulse energy is absorbed in vapor ionizing it and creating a plasma cloud. Expanding of this cloud to every side of the droplet produces a new plasma channel 72 between the liquid jet anode 50 and the liquid jet cathode 52. This new plasma channel 72 will shortcut the current in main plasma channel 58.

It goes without saying that an embodiment of the invention may be applied in other types of radiation source, e.g., other discharge produced plasma (DPP) EUV sources.

An embodiment of the invention leads to a smaller overall resistance of the discharge between the anode and the cathode, thereby decreasing the heat production near the electrodes. Therefore less heat needs to be removed. Furthermore, current in an external circuit will be larger thereby allowing the gathering of additional electric energy there, thus increasing overall CE, which is a ratio of (EUV) radiation to electric energy consumed by the discharge. Part of the energy consumed by the discharge after an EUV pulse is useless for EUV production and therefore it will be good to decrease it. If a larger part of the energy can be gathered in an external circuit for use in a next pulse then a larger overall CE will be reached.

It is noted that instead of using Sn (tin) one or more other metals may be used such as an alloy of tin and gallium, indium, or an alloy of tin and indium, which are known for producing EUV radiation, or any substance known for producing a good conductivity plasma channel in the case of using a third body.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A radiation source, comprising:
   an anode and a cathode that are configured and arranged to create a discharge in a substance in a discharge space between the anode and the cathode and to form a plasma so as to generate electromagnetic radiation;

a first activation source arranged to direct a first energy pulse onto a first spot in the radiation source near the discharge space so as to create a main plasma channel which triggers the discharge; and a second activation source arranged to direct a second energy pulse onto a second spot in the radiation source near the discharge space so as to create an additional plasma channel, which forms a short circuit between the anode and the cathode, the second spot being a different spot than the first spot and the second activation source arranged to generate the second energy pulse during the discharge.

2. The radiation source of claim 1, wherein the first and second energy pulses are laser pulses.

3. The radiation source of claim 1, wherein the electromagnetic radiation comprises EUV radiation.

4. The radiation source of claim 1, wherein the first spot and the second spot are located on the cathode.

5. The radiation source of claim 1, wherein the first spot and the second spot are located on the anode.

6. The radiation source of claim 1, wherein the anode comprises a liquid jet anode and wherein the cathode comprises a liquid jet cathode.

7. The radiation source of claim 6, further comprising a droplet producing unit arranged to shoot droplets between the cathode and the anode, and wherein the second activation source is arranged to direct the second energy pulse onto one of the droplets when the one droplet is in between the cathode and the anode.

8. The radiation source of claim 7, wherein the liquid droplet is made of either tin or a tin containing metal alloy.

9. The radiation source of claim 7, wherein the liquid droplet is made of a material which is different from that of the liquid jet anode and the liquid jet cathode.

10. The radiation source of claim 1, wherein the first and second activation sources are arranged to allow the first and the second energy pulses hit the respective first and second spots with a time difference that is between about 10-100 ns.

11. The radiation source of claim 1, wherein the first activation source and the second activation source are one activation source.

12. A lithographic apparatus, comprising:
a radiation source, comprising:
an anode and a cathode that are configured and arranged to create a discharge in a substance in a discharge space between the anode and the cathode and to form a plasma so as to generate electromagnetic radiation,
a first activation source arranged to direct a first energy pulse onto a first spot in the radiation source near the discharge space so as to create a main plasma channel which triggers the discharge, and
a second activation source arranged to direct a second energy pulse onto a second spot in the radiation source near the discharge space so as to create an additional plasma channel, which forms a short circuit between the anode and the cathode, the second spot being a different spot than the first spot and the second activation source arranged to generate the second energy pulse during the discharge;

an illumination system configured to condition the electromagnetic radiation into a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

13. The lithographic apparatus of claim 12, wherein the first and second activation sources are arranged to allow the first and the second energy pulses hit the respective first and second spots with a time difference that is between about 10-100 ns.

14. The lithographic apparatus of claim 12, wherein the first activation source and the second activation source are one activation source.

15. The lithographic apparatus of claim 12, wherein the first and second energy pulses are laser pulses.

16. The lithographic apparatus of claim 12, wherein the first spot and the second spot are located on the cathode, or the anode, or both the cathode and the anode.

17. A method of producing radiation, comprising:
creating a voltage across an anode and a cathode of a radiation source;
directing a first energy pulse onto a first spot in the radiation source so as to create a main plasma channel which triggers a discharge between the anode and the cathode;
directing a second energy pulse onto a second spot in the radiation source so as to create an additional plasma channel between the anode and the cathode, the additional plasma channel forming a short circuit between the anode and the cathode, and the second spot being a different spot than the first spot and the second energy pulse being generated during the discharge.

18. The method of claim 17, wherein the first and the second energy pulses hit the respective first and second spots with a time difference that is between about 10-100 ns.

19. The method of claim 17, wherein the anode comprises a liquid jet anode and wherein the cathode comprises a liquid jet cathode.

20. The method of claim 19, further comprising providing droplets between the cathode and the anode and directing the second energy pulse onto one of the droplets when the one droplet is in between the cathode and the anode.

* * * * *

UNITED STATES PATENT AND TRADEMARK OFFICE
CERTIFICATE OF CORRECTION

| | |
|---|---|
| PATENT NO. | : 7,518,135 B2 |
| APPLICATION NO. | : 11/641945 |
| DATED | : April 14, 2009 |
| INVENTOR(S) | : Vladimir Vitalevitch Ivanov et al. |

It is certified that error appears in the above-identified patent and that said Letters Patent is hereby corrected as shown below:

On the title page item (56) References Cited:

The foreign reference listed under the Foreign Patent Documents as "WO 2005/02032 A2" should be listed as --WO 2005/060321 A2--.

Signed and Sealed this

Twenty-fifth Day of August, 2009

David J. Kappos
*Director of the United States Patent and Trademark Office*